United States Patent [19]
Drage

[11] Patent Number: 5,858,547
[45] Date of Patent: Jan. 12, 1999

[54] NOVOLAC POLYMER PLANARIZATION FILMS FOR MICROELECTRONIC STRUCTURES

[75] Inventor: James Steven Drage, Fremont, Calif.

[73] Assignee: AlliedSignal, Inc., Morristown, N.J.

[21] Appl. No.: 271,291

[22] Filed: Jul. 6, 1994

[51] Int. Cl.⁶ .................................................. B32B 13/12
[52] U.S. Cl. ............................................................ 428/451
[58] Field of Search .............................. 257/793; 428/451

[56] References Cited

U.S. PATENT DOCUMENTS

| | | | |
|---|---|---|---|
| 3,947,393 | 3/1976 | Sato et al. | 260/19 N |
| 4,167,500 | 9/1979 | Jazenski et al. | 260/29.3 |
| 4,427,713 | 1/1984 | White et al. | 427/54.1 |
| 4,511,430 | 4/1985 | Chen et al. | 156/643 |
| 4,515,828 | 5/1985 | Economy et al. | 427/82 |
| 4,520,041 | 5/1985 | Aoyama et al. | 427/88 |
| 4,532,005 | 7/1985 | Grieco et al. | 156/661.1 |
| 4,604,162 | 8/1986 | Sobezak | 156/657 |
| 4,619,837 | 10/1986 | Brown | 427/44 |
| 4,621,042 | 11/1986 | Pampalone et al. | 430/271 |
| 4,621,045 | 11/1986 | Goodner | 430/311 |
| 4,701,390 | 10/1987 | Grunwald et al. | 430/325 |
| 4,762,768 | 8/1988 | Grunwald et al. | 430/324 |
| 4,904,516 | 2/1990 | Creamer | 528/129 |
| 5,178,988 | 1/1993 | Leech et al. | 430/280 |
| 5,276,126 | 1/1994 | Rogler | 528/155 |

FOREIGN PATENT DOCUMENTS

| | | |
|---|---|---|
| 0 260 994 | 3/1988 | European Pat. Off. . |
| 285 245 | 10/1988 | European Pat. Off. . |
| 294372A5 | 9/1991 | Germany . |

OTHER PUBLICATIONS

Stanley Wolf and Richard N. Tauber, "Silicon Processing for The VLSI Era", vol. 1, pp. 418–420, (1986).

L.K. White, "Planarization Properties of Resist and Polyimide Coatings", vol. 130(7), pp. 1543–1548, Journal of the Electrochemical Society, Jul. 1983.

I.E. Stillwagon and G.N. Taylor, "Evaluation of Several Organic Materials as Planarizing Layers for Lithographic and Etchback Processing" *Polymers in Microlithography*, ACS Symp, Series vol. 412, pp. 252–265, (1989).

FR 2392495 . . . (English Abstract) (Jan. 26, 1979).

DD 294372 (English Abstract) (Sep. 26, 1991).

*Primary Examiner*—Edward J. Cain

[57] ABSTRACT

An improved method for forming planarization films which remain adhered to substrates upon exposure to heat comprising first applying a polymeric solution containing a low molecular weight novolac resin, a surfactant selected from the group consisting of a non-fluorinated hydrocarbon, a fluorinated hydrocarbon and combinations thereof, and an optional organic solvent to a substrate, followed by heating the substrate.

25 Claims, No Drawings

NOVOLAC POLYMER PLANARIZATION FILMS FOR MICROELECTRONIC STRUCTURES

BACKGROUND OF THE INVENTION

1. Field of the Invention

The present invention relates to novolac polymer planarization films for microelectronic structures, such as integrated circuits. More particularly, this invention relates to an improvement in the formation of a planarization film which remains adhered to substrates upon exposure to heat.

2. Background of the Invention

Novolac polymers have been used extensively in the manufacture of substrates, such as multichip modules, printed circuit boards, integrated circuits and other microelectronic devices. For example, photoresists used for microlithographic patterning of circuitry often contain a novolac component. See e.g., Wolf, et al., "Silicon Processing for the VLSI Era, 1 Process Technology" 418 (1986).

In addition, novolac polymers are also contained within planarizing films used in the fabrication of microelectronic devices. As used herein, the term "planarizing film" refers to a film coated onto a patterned substrate surface for the purpose of smoothing the topography of the substrate.

The planarization or smoothing of surfaces is essential in the fabrication of integrated circuits. For example, as optical lithography is used to define even smaller features, the depth of focus of the exposure tool will decrease. Therefore, it is necessary to employ planarizing films to smooth or "level" the topography of microelectronic devices in order to properly pattern the increasingly more complex integrated circuits. See e.g., Stillwagon, et al., Evaluation of Several Organic Materials as Planarizing Layers for Lithographic and Etchback Processing, 412 Polymers in Micrography, ACS Symp. Series, 252–265 (1989).

For a film to be useful for planarization, it must continuously and completely cover a substrate, such as a silicon wafer, when the latter is subjected to temperatures ranging between about 20° C. and about 300° C., to vacuum pressures, and to etching processes, such as wet chemical or plasma. As used herein, "continuously" means that the film does not have "bare spots" whereat the substrate surface is revealed.

Low number average molecular weight novolac polymers, i.e. those ranging between about 200 and about 2000 atomic mass units ("amu"), are especially useful in forming planarizing films because they tend to flow more readily than other polymers having higher molecular weights. Unless indicated otherwise, all references herein to "molecular weight" are to be construed as number average molecular weight. Such polymers having low viscosities, i.e. between about 10 centipoises and about 2000 centipoises at temperatures in the range of about 120° C. to about 150° C., are preferred since, when dried, they form either locally, regionally or globally planarized films on patterned substrates.

As used herein, the term "local planarization" refers to a condition wherein the film is planar or flat over a distance of 0 to about 5 linear micrometers. "Regional planarization" refers to a condition wherein the film is planar or flat over a distance of at least about 5 to about 50 linear micrometers on the substrate surface. "Global planarization" refers to the same situation over larger substrate surfaces, i.e. about 50 to about 1000 linear micrometers.

After the polymer material is applied to the substrate by conventional spinning techniques, the polymer-substrate composition is heated to evaporate any residual solvent present within the film material, to further reduce the viscosity of the film, and to enhance leveling of the film on the substrate. One difficulty in achieving the desired planarization is caused by the delamination of film from the substrate during this heating process. Another difficulty is that the evaporation of the solvent from the polymer solution, which occurs after the solution is spun across the substrate surface, causes a reduction in the total volume of the planarization material which, in turn, results in non-uniform coatings.

One method that has been suggested for improving the adhesion of films to substrates is to employ substrate surface modification, whereby the substrate is coated with a thin layer of an adhesion promoter, such as 3-aminopropyltriethoxysilane. However, this technique is undesirable because it adds extra steps and costs into the film formation process.

Other commonly used techniques, such as chemical and plasma surface cleaning treatments or surface roughening treatments, i.e. ion bombardment, have been used for the purpose of improving the adhesion of the film to the substrate by way of increasing the contact area therebetween. However, these techniques are not only more costly and time consuming, but also the substrate often incurs radiation damage from the plasma source.

The use of surfactants in novolac polymer solutions especially formulated for film formation is known. However, these surfactant-containing solutions are comprised of novolac polymers having higher molecular weights, i.e. novolacs which are greater than 10,000 amu, and are only useful in the formation of photoresists, as opposed to the formation of planarizing films. These solutions contain only small amounts of surfactants primarily for the purpose of preventing striations or irregularities in the novolac or photoresist film thicknesses.

It would be desirable to provide an improved process for forming continuous, uniform planarization films whereby the films produced therefrom would be not only useful for achieving regional or global planarization of microelectronic substrates, but also would not delaminate from the substrates upon exposure to heat. It would also be desirable to provide a composition which can be used to form such planarized films.

SUMMARY OF THE INVENTION

In accordance with this invention, there is provided an improvement in the process of forming a continuous planarization film on a substrate such that the film remains adhered to the substrate upon exposure to heat comprising:

(a) applying to a surface of the substrate a polymeric solution comprising a low molecular weight novolac resin and a surfactant selected from the group consisting of non-fluorinated hydrocarbons, fluorinated hydrocarbons, and combinations thereof; and (b) heating the solution and substrate to form a continuous planarized film on the surface.

In accordance with another aspect of this invention, there is provided a substrate having a continuous planarized film applied thereon, the film comprising a low molecular weight novolac resin and a surfactant selected from the group consisting of non-fluorinated hydrocarbons, fluorinated hydrocarbons, and blends thereof, whereby the film will not delaminate from the substrate upon exposure to heat.

In accordance with another aspect of this invention, there is provided a novel composition for use in the preparation of uniform, continuous planarized films to be coated onto substrates whereby the film does not delaminate from the substrate upon exposure to heat, the composition comprising a low molecular weight novolac resin, a surfactant selected from the group consisting of non-fluorinated hydrocarbons, fluorinated hydrocarbons, and blends thereof, and an optional organic solvent.

In yet another embodiment of this invention, there is provided an improvement in the process of forming a continuous planarization film onto a substrate such that the film remains adhered to the substrate upon exposure to heat comprising:

(a) centrally applying to the substrate a polymeric solution comprised of a low molecular weight novolac resin and a surfactant selected from the group consisting of non-fluorinated hydrocarbons, fluorinated hydrocarbons, and blends thereof;

(b) spinning the substrate at a speed of 1500 rpm to 4000 rpm for a time sufficient to spread the solution evenly across the surface of the substrate; and (c) heating the solution and substrate to form a continuous planarized film on the substrate.

The continuous planarized films of this invention not only advantageously form a continuous, level, smooth surface on substrates having patterned (irregular) topographies, such as integrated circuit structures, but they also will not delaminate from the substrate upon exposure to heat, that is temperatures which are employed to evaporate residual solvent and to induce film flow for planarizing the substrate. Typically, such temperatures are from about 25° C. to about 300° C. The method for forming the film onto a substrate as provided herein also advantageously reduces production cycle time for such coated substrates by not requiring the extra, initial step of forming an adhesion layer on the substrate.

DESCRIPTION OF THE PREFERRED EMBODIMENTS

Unless indicated otherwise, all references herein are specified in weight.

The continuous planarized film of this invention is prepared from a composition formed by initially mixing a novolac polymer and a surfactant, preferably at room temperature and pressure.

The novolac polymers suitable for use in this invention are commercially available or may be derived via reacting phenols or derivatives therefrom, such as ortho-, meta-, and para-cresol, with formaldehyde. The generalized structure of such novolacs is represented below in formula I:

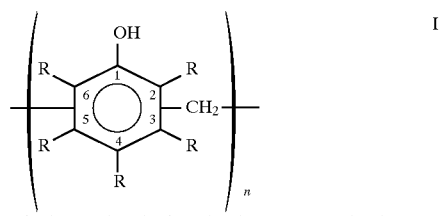

wherein each R independently is a hydrogen or a hydrocarbon group containing up to 20 carbons and n ranges between 2 and 200. Any of the R groups may be bonded to any of the aromatic carbon atoms, i.e. $C_2$ to $C_6$. Similarly, the $CH_2$ (methylene) groups may be bonded either to any of the aromatic carbon atoms, to $C_2$ to $C_6$, or to any aromatic ring. The average ratio of methylene groups to aromatic rings in the polymer may vary from between about 0.5 to about 1.5.

Optionally, the novolac polymer may also contain crosslinking groups such as those derived from hexamethylenetriamine.

The preferred novolac polymer is a low olecular weight novolac having a molecular weight ranging between about 200 and about 20,000, preferably between about 200 to about 2000, and more preferably between about 200 to about 1200 amu. Such preferred novolac polymers include phenolic novolacs derived from phenol and having aromatic rings bonded to hydrogen atoms, methylene groups and a hydroxyl group. Also preferred are the cresylic novolac polymers derived from ortho-, meta-, or para-cresol having aromatic rings bonded to one methylene group in a position either ortho, meta, or para to the hydroxyl groups and aromatic rings bonded to methylene groups and a hydroxyl group. Copolymer cresylic novolacs derived from varying combinations of ortho-, meta- and para-cresol and copolymers and blends derived from varying combinations of phenol and ortho-, para-, and meta-cresol may also preferred. Phenolic novolac resins are most preferred.

Suitable novolac polymers preferably contain about 500 parts per billion or less, preferably 200 parts per billion or less, of metallic impurities, such as sodium or potassium.

Surfactants suitable for this invention include non-fluorinated and fluorinated hydrocarbonated organic compounds and blends thereof. Suitable non-fluorinated hydrocarbon surfactants may be comprised of alkylated derivatives of organic acids and esters thereof having from about 5 to about 50 carbons, preferably from about 10 to about 30 carbons and combinations thereof. More specifically, particular non-fluorinated hydrocarbon surfactants include di-octyl sulfosuccinate and fatty alcohol polyglycol sulfosuccinate, both of which are commercially available from Sherex Chemical Company Inc. of Dublin Ohio, under the tradename Varsulf, and combinations thereof. Suitable fluorinated hydrocarbon surfactants may be comprised of alkylated derivatives of organic acids and esters thereof having from about 5 to about 50 carbons, preferably from about 10 to about 30 carbons, and at least one carbon-fluorine bond, and combinations thereof. More specifically, particular fluorinated hydrocarbon surfactants include fluoroaliphatic oxyethylene adducts, fluorinated alkyl alkoxylates and sulfonamides containing from about 5 to about 20 carbon atoms, fluoroaliphatic polymeric esters derived from monomers comprised of partially fluorinated hydrocarbon chains containing from about 5 to about 20 carbon atoms with terminal ester groups attached thereto, fluoroaliphatic copolymers derived from monomers comprised of partially fluorinated hydrocarbon chains containing from about 5 to about 20 carbon atoms with terminal functional groups selected from esters and acids attached thereto, and the like, and combinations thereof. These fluorinated surfactants are commercially available from 3M.

Other fluorinated hydrocarbon surfactants include fluoroalkyl sulfonate alkylammonium salts which contain from about 5 to about 60 carbon atoms, and more specifically, fluoroalkyl sulfonate tetraalkylammonium salts containing from about 5 to about 60 carbon atoms. Methods for preparing these fluoroalkyl sulfonate alkylammonium salt surfactants are known in the art.

Fluoroaliphatic polymeric esters of the empirical formula $C_xH_yF_zO_aN_b$, where x=from about 5 to about 10, y=from about 0 to about 20, z=from about 1 to about 20, a=from about 2 to about 6, and b=from about 0 to about 1, and having a molecular weight of about 5500–8500 amu are preferred. Fluoroaliphatic polymeric esters of the above empirical formula with x=about 8, y=about 13, z=about 1, a=about 4, and b=about 0 and a molecular weight of about 7000 amu are more preferred.

Suitable surfactants have 5 parts per million or less, preferably 2 parts per million or less of the above-described metallic impurities.

An organic solvent may optionally be included as a third component in the polymeric solution. Solvents suitable for this invention include aliphatic and aromatic hydrocarbons, alcohols, ketones, esters, ethers, ether alcohols, ether esters, alcohol esters, ketone esters, ketone ethers, ketone alcohols, amides, nitrites, and combinations thereof. More specifically, particular solvents include ethanol, isopropyl alcohol, n-propyl alcohol, n-butyl alcohol, acetone, methyl ethyl ketone, methyl isobutyl ketone ("MIBK"), ethyl acetate, ethyl lactate, n-butylacetate, propylene glycol monoethyl ether acetate, 2-ethoxyethyl acetate, 2-methyoxyethylether (diglyme), methylmethoxy propionate, ethyl pyruvate, 2-heptanone, 3-ethylethoxypropionate, 4-hydroxy-4-methyl-2-pentanone, cyclohexanone, amyl acetate, and combinations thereof.

The preferred solvents for this invention are n-butyl alcohol, methyl isobutyl ketone, ethyl lactate, n-butyl acetate, propylene glycol monoethylether acetate, methylmethoxy propionate, ethyl pyruvate, 2-hepanone, 3-ethylethoxy propionate, 4-hydroxy-4-methyl-2-pentanone, cyclohexanone, amyl acetate and combinations thereof.

The polymeric solution preferably contains from about 1 to about 90 percent, more preferably between from about 10 to about 50 percent, and most preferably from about 20 to about 40 percent, based upon the total weight of the polymeric solution, of the novolac polymer and preferably from about 0.01 to about 5 percent, more preferably from about 0.1 percent to about 1 percent, and most preferably from about 0.3 to about 0.7 percent, based upon the total weight of the polymeric solution, of surfactant. The optional solvent may be present in an amount ranging between about 10 to about 90 percent, preferably between about 50 to about 90 percent, and most preferably between about 60 to about 80 percent, based upon the total weight of the polymeric solution.

The polymeric solution may be applied to the substrate by any conventional means, such as spin-coating. Preferably, the solution is centrally applied to the substrate, which is then spun at speeds ranging between about 500 and about 6000 rpm, preferably between about 1500 and about 4000 rpm, for about 5 to about 60 seconds, preferably about 10 to about 30 seconds, in order to spread the solution evenly across the substrate surface.

Typically the compositions of this invention are applied onto wafer substrates, such as silicon wafers which have a circuit pattern on their surface, to be processed into integrated circuits or other microelectronic devices.

The coated substrate is then heated by any conventional means known in the art. Preferably, the combination is heated by placing it on top of a hot plate. Typically this is done commercially via a conventional integrated spin-coater/hot plate system. This type of heating not only rapidly and directly expels the solvent from the solution and causes the film to flow, but is also easily adaptable for continuous processing operations. The coated substrate is typically heated for about 0.5 minutes to about 5.0 minutes at temperatures ranging between about 50° C. and about 300° C., more preferably about 100° C. and about 200° C. Multiple hot plates, i.e. between about 2 and about 5, may be used with the same time and temperature ranges applying, although heating via one hot plate is preferred.

After the coating is heated, the thickness of the resulting film ranges from about 0.2 to about 3.0 micrometers, preferably from about 0.5 to about 2.5 micrometers, and most preferably from about 0.7 to about 2.0 micrometers. The films produced by this invention generally exhibit a thickness standard deviation less than 2%, and preferably less than 1%, of the average film thickness.

The following non-limiting examples illustrate the effect of coating substrates with the novolac polymer solutions of the present invention in order to create an improved continuous planarized film thereon.

EXAMPLES

EXAMPLE 1

39.70 g of a low molecular weight (750 amu) cresylic novolac polymer was dissolved under ambient conditions in 29.78 g of n-butyl alcohol and 29.78 g of 1-methoxy-2-propanol to yield 99.26 g of a cresylic novolac polymer solution. 1.74 of a fluoroaliphatic polymeric ester surfactant solution containing 10 percent of a surfactant of empirical formula $C_xH_yF_zO_aN_b$, where x=from about 5 to about 10, y=from about 9 to about 16, z=from about 1 to about 2, a=from about 2 to about 6, and b=from about 0 to about 1, and a molecular weight of about 5500–8500 amu, and 90 percent n-butyl alcohol, was added under ambient conditions to 34.8 g of the cresylic novolac polymer solution. The resulting polymeric solution was then dispensed via pipette onto an unpatterned silicon wafer, and the latter was spun at about 3000 rpm for about 20 seconds to uniformly spread the polymeric solution across the surface of the wafer to provide a coating of about 1 micrometer to about 4 micrometers thick. The wafer was then placed on a 120° C. hot plate for about 2 minutes, and then on a 210° C. hot plate for 2 minutes.

The resulting film formed on the wafer did not dewet, bead-up, or delaminate therefrom. As used herein, the terms "dewet" or "bead-up" refer to a condition when a film, while in the partially-liquid stage, pulls away from the surface of a substrate and forms "beads", as opposed to a continuous film, thereon. The average film thickness measured was 2.08 micrometers, with a standard deviation of 20 nanometers (0.96% of the average thickness). The resultant coated wafer had a substantially uniform planar surface thereon.

EXAMPLE 2 (Comparative)

2 g of the cresylic novolac solution without surfactant as prepared in Example 1 was applied to an unpatterned silicon wafer, spun, then heated in the manner described in Example 1. During the 2 minutes while the wafer was heated at 120° C., the film dewetted and delaminated extensively. Approximately 20% of the wafer was not covered by the film at the end of the heating treatments.

EXAMPLE 3

39.73 g of a low molecular weight (950 amu) phenolic novolac resin was dissolved at room temperature and pressure in 29.79 g of n-butyl alcohol and 29.79 g of 1-methoxy-2-propanol to yield 99.32 g of a novolac polymer solution. 0.50 g of the surfactant solution of Example 1 was added under ambient conditions to 10.28 g of the novolac polymer solution. The resulting polymeric solution was applied to an unpatterned silicon wafer and spun in the same manner as described in Example 1. The wafer was then placed on a 150° C. hot plate for about 1 minute, then onto a 250° C. hot plate for about 2 minutes.

The resulting film did not dewet, bead-up, or delaminate from the wafer. The average film thickness measured was 1.74 micrometers, with a standard deviation of 15.1 nanometers (0.87% of average thickness). The coated wafer also had a substantially uniform planar surface thereon.

EXAMPLE 4 (Comparative)

The novolac solution without surfactant as prepared in Example 3 was spun onto an unpatterned silicon wafer in the manner described in Example 1. While the wafer was being heated for one minute at 150° C., the film extensively dewetted from the substrate. The wafer was then heated for 2 minutes at 250° C., after which approximately 70 percent of the wafer's surface was not covered with film.

EXAMPLE 5

400 g of the phenolic novolac resin of Example 3 was dissolved in 600 g of methyl isobutyl ketone at room temperature and pressure. To this solution were added 24.47 g of the surfactant solution of Example 1 and 25.76 g of additional MIBK to yield 1050.23 g of novolac polymer solution. 2 g of this novolac polymer solution were applied via pipette to an unpatterned silicon wafer and spun at about 2100 rpm for about 20 seconds. The wafer was then placed on a 200° C. hot plate for 2 minutes.

The resulting film formed on the wafer did not dewet, bead-up, or delaminate therefrom. The average film thickness measured was 2.04 micrometers, with a thickness standard deviation of 3.6 nanometers (0.18% of the average thickness). The resultant coated wafer had a substantially uniform planar surface thereon.

EXAMPLE 6

2 g of the phenolic novolac polymer solution containing the surfactant of Example 5 were applied via pipette to a patterned silicon wafer and spun at about 1000 rpm for about 20 seconds. The wafer was then placed on a 200° C. hot plate for about 2 minutes.

The resulting film formed on the wafer did not dewet, bead-up, or delaminate therefrom. The average film thickness was 2.04 micrometers, with a thickness standard deviation of 5.0 nanometers (0.25% of the average thickness). The resultant coated wafer was substantially globally planarized.

The above-described Examples illustrate that low molecular weight novolac solutions which do not contain the claimed surfactant (Examples 2 and 4) tended to rapidly delaminate upon exposure to heat. By contrast, the solutions containing a surfactant not only did not delaminate from the substrate after exposure to heat, but also resulted in a smooth planarized film which continuously covered the substrate surface.

What is claimed is:

1. In a process of forming a continuous planarization film onto a substrate such that said film remains adhered to said substrate upon exposure to heat, the improvement comprising:

(a) applying to a surface of said substrate a polymeric solution comprising a low molecular weight novolac resin having the formula

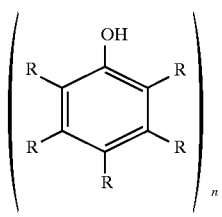

wherein each R is independently hydrogen or a hydrocarbon group containing up to 20 carbon atoms and n ranges from between 2 and 200; and a surfactant selected from the group consisting of a non-fluorinated hydrocarbon, a fluorinated hydrocarbon and combinations thereof; and (b) heating said solution and substrate to form a continuous planarized film on said surface.

2. The process of claim 1 wherein said solution additionally comprises an organic solvent.

3. The process of claim 2 wherein said solution comprises, based upon the total weight of said solution, from about 1 to 90 weight percent of a low molecular weight novolac resin, from about 0.01 to about 5 weight percent of said surfactant, and from about 0 to about 90 percent of said solvent.

4. The process of claim 3 wherein said solution comprises from about 20 to about 40 weight percent of said low molecular weight novolac resin, from about 0.3 to about 0.7 weight percent of said surfactant, and from about 60 to about 80 percent of said solvent.

5. The process of claim 2 wherein said novolac resin is selected from the group consisting of phenolic novolacs, para-cresylic novolacs, ortho-cresylic novolacs, meta-cresylic novolacs and copolymers and blends thereof.

6. The process of claim 2 wherein said novolac resin has a molecular weight between about 200 and 20,000 amu.

7. The process of claim 2 wherein said novolac resin is a phenolic resin.

8. The process of claim 2 wherein said non-fluorinated hydrocarbon surfactant is comprised of an aliphatic derivative of organic acids and esters thereof having from about 5 to about 50 carbons, and combinations thereof.

9. The process of claim 8, wherein said non-fluorinated hydrocarbon surfactant is selected from the group consisting of di-octyl sulfosuccinate, fatty alcohol polyglycol sulfosuccinates and combinations thereof.

10. The process of claim 2 wherein said fluorinated hydrocarbon surfactant is comprised of an aliphatic derivative of organic acids and esters thereof having from about 5 to about 50 carbons and at least one carbon-fluorine bond, a fluoroalkyl sulfonate alkylammonium salt having from about 5 to about 60 carbons and at least one carbon-fluorine bond, and combinations thereof.

11. The process of claim 10 wherein said fluorinated hydrocarbon surfactant is selected from the group consisting of fluoroaliphatic oxyethylene adducts, fluorinated alkyl alkoxylates containing from about 5 to about 20 carbon atoms, fluorinated alkyl sulfonamides containing from about 5 to about 20 carbon atoms, fluoroaliphatic polymeric esters derived from monomers comprised of partially fluorinated hydrocarbon chains containing from about 5 to about 20 carbon atoms with terminal ester groups attached thereto, fluoroaliphatic copolymers derived from monomers comprised of partially fluorinated hydrocarbon chains containing from about 5 to about 20 carbon atoms with terminal functional groups selected from esters and acids attached thereto, a fluoroalkyl sulfonate tetraalkylammonium salt having from about 5 to about 60 carbons, and combinations thereof.

12. The process of claim 11 wherein said fluorinated hydrocarbon surfactant is a fluoroaliphatic polymeric ester of the empirical formula $C_xH_yF_zO_aN_b$, where x=from about 5 to about 10, y=from about 0 to about 20, z=from about 1 to about 20, a=from about 2 to about 6, and b=from about 0 to about 1, and has a molecular weight of about 5500–8500 atomic mass units.

13. The process of claim 2 wherein said solvent is selected from the group consisting of aliphatic and aromatic hydrocarbons, alcohols, ketones, esters, ethers, ether alcohols, ether esters, alcohol esters, ketone esters, ketone ethers, ketone alcohols, amides, nitrites, and combinations thereof.

14. In a process of forming a continuous planarization film onto a substrate such that said film remains adhered to said substrate upon exposure to heat, the improvement comprising:
(a) centrally applying to a surface of said substrate a polymeric solution comprising a low molecular weight novolac resin having the formula

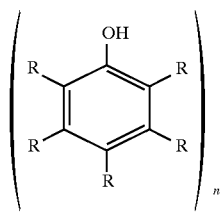

wherein each R is independently hydrogen or a hydrocarbon group containing up to 20 carbon atoms and n ranges from between 2 and 200; and a surfactant selected from the group consisting of a non-fluorinated hydrocarbon, a fluorinated hydrocarbon and combinations thereof;
(b) spinning said substrate at a speed of 1500 rpm to 4000 rpm for a time sufficient to spread said solution evenly across said surface of said substrate; and
(c) heating said solution and substrate to form a continuous planarized film on said substrate.

15. A substrate having a continuous planarizing film applied thereon, said film comprising a novolac resin having the formula

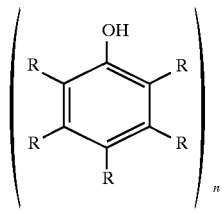

wherein each R is independently hydrogen or a hydrocarbon group containing up to 20 carbon atoms and n ranges from between 2 and 200; and a surfactant selected from the group consisting of a non-fluorinated hydrocarbon, a fluorinated hydrocarbon, and combinations thereof.

16. The substrate of claim 15 wherein said substrate is a wafer.

17. A composition comprising, based upon the total weight of the composition:
from about 1 to about 90 weight percent of a novolac resin;
from about 0.01 to about 5 weight percent of a surfactant selected from the group consisting of a fluorinated hydrocarbon, a non-fluorinated hydrocarbon and combinations thereof; and
from about 0 to about 90 percent of an organic solvent.

18. The composition of claim 17 wherein said resin is selected from the group consisting of phenolic novolacs, para-cresylic novolacs, ortho-cresylic novolacs, meta-cresylic novolacs and copolymers and blends thereof.

19. The composition of claim 17 wherein said fluorinated hydrocarbon surfactants are selected from the group consisting of fluoroaliphatic oxyethylene adducts, fluorinated alkyl alkoxylates containing from about 5 to about 20 carbon atoms, fluorinated alkyl sulfonamides containing from about 5 to about 20 carbon atoms, fluoroaliphatic polymeric esters derived from monomers comprised of partially fluorinated hydrocarbon chains containing from about 1 to about 20 carbon atoms with terminal ester groups attached thereto, fluoroaliphatic copolymers derived from monomers comprised of partially fluorinated hydrocarbon chains containing from about 5 to about 20 carbon atoms with terminal functional groups selected from esters and acids attached thereto, a fluoroalkyl sulfonate tetraalkylammonium salt having from about 5 to about 60 carbons, and combinations thereof.

20. The composition of claim 19 wherein said fluorinated hydrocarbon surfactant is a fluoroaliphatic polymeric ester of the empirical formula $C_xH_yF_zO_aN_b$, where x=from about 5 to about 10, y=from about 0 to about 20, z=from about 1 to about 20, a=from about 2 to about 6, and b=from about 0 to about 1, and has a molecular weight of about 5500–8500 atomic mass units.

21. The process of claim 1 wherein said surface of said substrate is locally, regionally, or globally planarized by said film.

22. The process of claim 14 wherein said surface of said substrate is locally, regionally, or globally planarized by said film.

23. The substrate of claim 15 wherein said substrate has a surface which is locally, regionally, or globally planarized by said film.

24. The substrate of claim 15 wherein the novolac resin has a molecular weight ranging from between about 200 and about 20,000.

25. The composition of claim 17 wherein the novolac resin has a molecular weight ranging from between about 200 and about 20,000.

* * * * *